(12) United States Patent
Choi

(10) Patent No.: US 6,236,074 B1
(45) Date of Patent: May 22, 2001

(54) SOLID STATE IMAGE SENSOR DEVICE AND METHOD OF FABRICATING THE SAME

(75) Inventor: Sun Choi, Kyonggi-do (KR)

(73) Assignee: LG Semicon Co., Ltd., Chungcheongbuk-do (KR)

(*) Notice: Subject to any disclaimer, the term of this patent is extended or adjusted under 35 U.S.C. 154(b) by 0 days.

(21) Appl. No.: 09/372,972

(22) Filed: Aug. 12, 1999

(30) Foreign Application Priority Data

Mar. 18, 1999 (KR) .................................................. 99-9236

(51) Int. Cl.$^7$ ...................................................... H01L 29/78
(52) U.S. Cl. .......................... 257/215; 257/214; 257/222; 257/232; 257/234
(58) Field of Search .................................. 257/214, 215, 257/222, 234, 232

(56) References Cited

U.S. PATENT DOCUMENTS

| | | | |
|---|---|---|---|
| 4,742,027 | 5/1988 | Blanchard et al. | 437/2 |
| 4,851,890 | * 7/1989 | Miyatake | 257/232 |
| 5,397,730 | 3/1995 | Hojo et al. | 437/53 |
| 6,078,211 | * 6/2000 | Kalnitsky et al. | 327/534 |

* cited by examiner

Primary Examiner—Fetsum Abraham
(74) Attorney, Agent, or Firm—Morgan, Lewis & Bockius LLP

(57) ABSTRACT

A solid state image sensor device and a method of fabricating the same are disclosed in the present invention. A solid state image sensor device includes a semiconductor substrate, a well region in the semiconductor substrate, a horizontal charge transmission region in the well region, a plurality of insulating layers in the horizontal charge transmission region, a gate insulating layer on the entire surface including the insulating layers, a plurality of first polygates on the gate insulating layer, the first polygates being separated from each other and overlapping a portion of each insulating layer, a plurality of impurity regions in the horizontal charge transmission region at both sides of each first polygate, an interlayer insulating layer on the entire surface including the first polygates, and a plurality of second polygates on the interlayer insulating layer and overlapped with a portion of each first polygate.

15 Claims, 7 Drawing Sheets

SOLID STATE IMAGE SENSOR DEVICE AND METHOD OF FABRICATING THE SAME

This application claims the benefit of Korean Application No. 9236/1999 filed Mar. 18, 1999, which is hereby incorporated by reference.

BACKGROUND OF THE INVENTION

1. Field of the Invention

The present invention relates to a solid state image sensor device, and more particularly, to a solid state image sensor device and a method of fabricating the same. Although the present invention is suitable for a wide scope of applications, it is particularly suitable for improving a horizontal charge transfer efficiency in the solid state image sensor device.

2. Discussion of the Related Art

In general, a solid state image sensor is a device which uses a combination of a photoelectric conversion device with a charge coupled device in taking an image of an objective and outputting the image as an electrical signal. The solid state image sensor device is used in transmitting signal charges generated in a photoelectric conversion device (i.e., a photodiode) through a microlens and a color filter in a particular direction in a substrate utilizing a potential variation. The solid state image sensor is provided with a plurality of photoelectric conversion regions, vertical charge coupled devices (VCCDs) having each one formed between the photoelectric conversion regions for vertical transmission of charges generated in the photoelectric conversion regions, a horizontal charge coupled device (HCCD) for horizontal transmission of the charge transmitted in the vertical direction by the VCCDs, and a floating diffusion region for sensing and amplifying the charges transmitted in the horizontal direction and supplying to a peripheral circuit.

A related art method of fabricating a solid state image sensor device will be explained with reference to the attached drawings. FIGS. 1A to 1D illustrate cross-sectional views showing the steps of a related art method for fabricating an HCCD.

Initially referring to FIG. 1A, the related art method of fabricating an HCCD begins by forming a P-well region 12 in a surface of an N type semiconductor substrate 11, and forming a buried charge coupled device (BCCD) 13 in the P-well region 12 by buried ion implantation for use as a charge transmission channel through which signal charges are transmitted in a horizontal direction.

As shown in FIG. 1B, a gate insulating layer 14 is formed on the semiconductor substrate 11 having the BCCD 13 region formed therein. Thereafter, a first polysilicon layer (not shown) is formed on the gate insulating layer 14. The first polysilicon layer is then patterned to form first polygates 15.

In FIG. 1C, for lowering a pinch-off level of second polygates to be formed in the later steps, P type ions are injected into surfaces of the semiconductor substrate 11 at both sides of the first polygates 15 to form barrier regions 16.

Subsequently, an interlayer insulating layer 17 is formed on the entire surface including the first polygates 15, as shown in FIG. 1D. A second polysilicon layer (not shown) is then deposited on the interlayer insulating layer 17 and subjected to selective etching, thereby forming second polygates 18 to overlap the barrier regions 16 and a portion of the first polygates 15.

FIG. 2 illustrates a potential profile of the related art HCCD, referring to which an operation principle of the related art HCCD will be explained.

As shown in FIG. 2, a first clock signal $H\phi 1$ (L) is applied to any one of the first and second polygates 15 and 18 while a second clock signal $H\phi 2$ (H) is applied to the adjacent first or second polygate 15 or 18, to transfer the photoelectric converted signal charge to an output terminal using a two-phase clocking. That is, even if signals of the same phase are applied to the first and second polygates 15 and 18, the barrier regions 16 cause the first and second polygates 15 and 18 to have a different level of potentials to transfer charges in a step form.

However, the related art method of fabricating an HCCD has the following problem.

In a low speed operation, there is no problem in terms of a charge transfer efficiency because there is much time for the signal charges to be transferred from a low potential to a high potential. However, in a high speed operation, the signal charges cannot be transferred to the adjacent gates properly in the present step form. This is due to a very short transfer time for the signal charges, so that a charge transfer efficiency is lowered, thereby deteriorating a performance of the HCCD.

SUMMARY OF THE INVENTION

Accordingly, the present invention is directed to a solid state image sensor device and a method of fabricating the same that substantially obviates one or more of the problems due to limitations and disadvantages of the related art.

An object of the present invention is to provide a solid state image sensor device and a method of fabricating the same, which can improve a charge transfer efficiency in both low and high speed operations, thereby improving a performance of an HCCD.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a solid state image sensor device includes a semiconductor substrate, a well region in the semiconductor substrate, a horizontal charge transmission region in the well region, a plurality of insulating layers in the horizontal charge transmission region, a gate insulating layer on the entire surface including the insulating layers, a plurality of first polygates on the gate insulating layer, the first polygates being separated from each other and overlapping a portion of each insulating layer, a plurality of impurity regions in the horizontal charge transmission region at both sides of each first polygate, an interlayer insulating layer on the entire surface including the first polygates, and a plurality of second polygates on the interlayer insulating layer and overlapped with a portion of each first polygate.

In another aspect of the present invention, a method of fabricating a solid state image sensor device on a semiconductor substrate, the method comprising the steps of forming a well region in the semiconductor substrate, forming a horizontal charge transmission region in the well region, forming a plurality of insulating layers in the horizontal charge transmission region, forming a gate insulating layer on the entire surface of the substrate including the insulating layers, forming a plurality of first polygates on the gate insulating layer, the first polygates being separated from each other and overlapping a portion of each insulating layer, forming a plurality of impurity regions in the horizontal charge transmission region at both sides of each first polygate, forming an interlayer insulating layer on the entire surface including the first polygates, and forming second polygates on the interlayer insulating layer to overlap a portion of each first polygate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
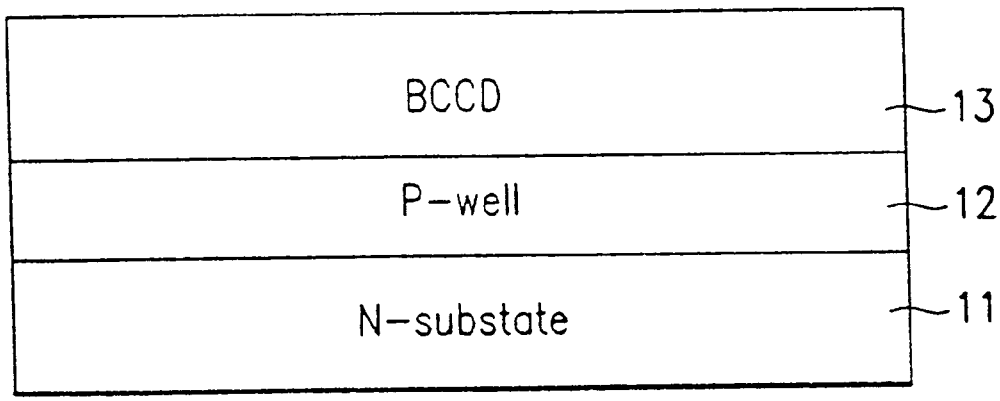
FIGS. 1A to 1D are cross-sectional views illustrating the process steps of a related art method of fabricating an HCCD.
Figure 1B:
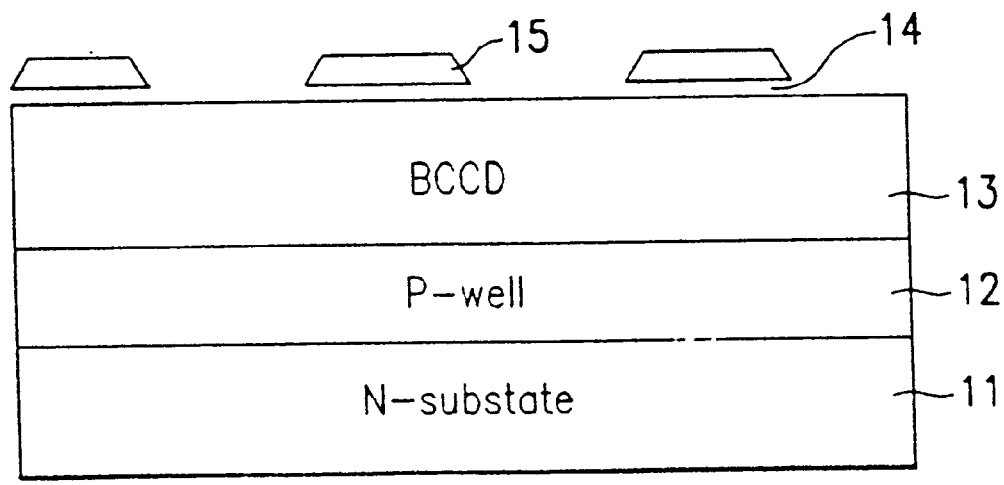
Figure 1C:
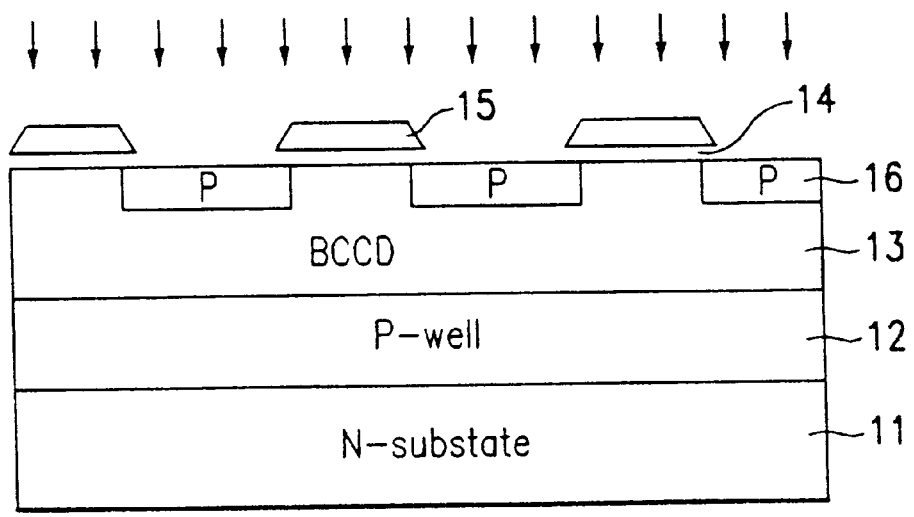
Figure 1D:
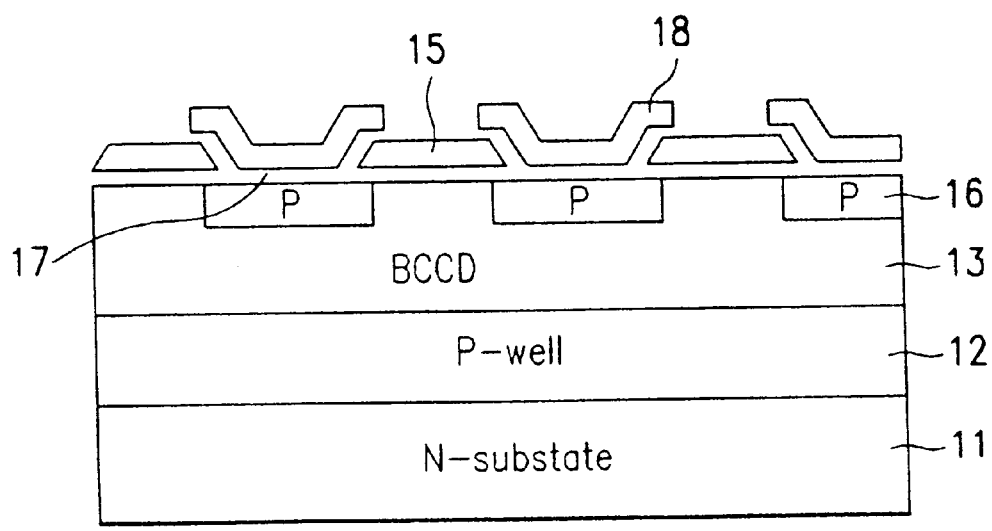
Figure 2:
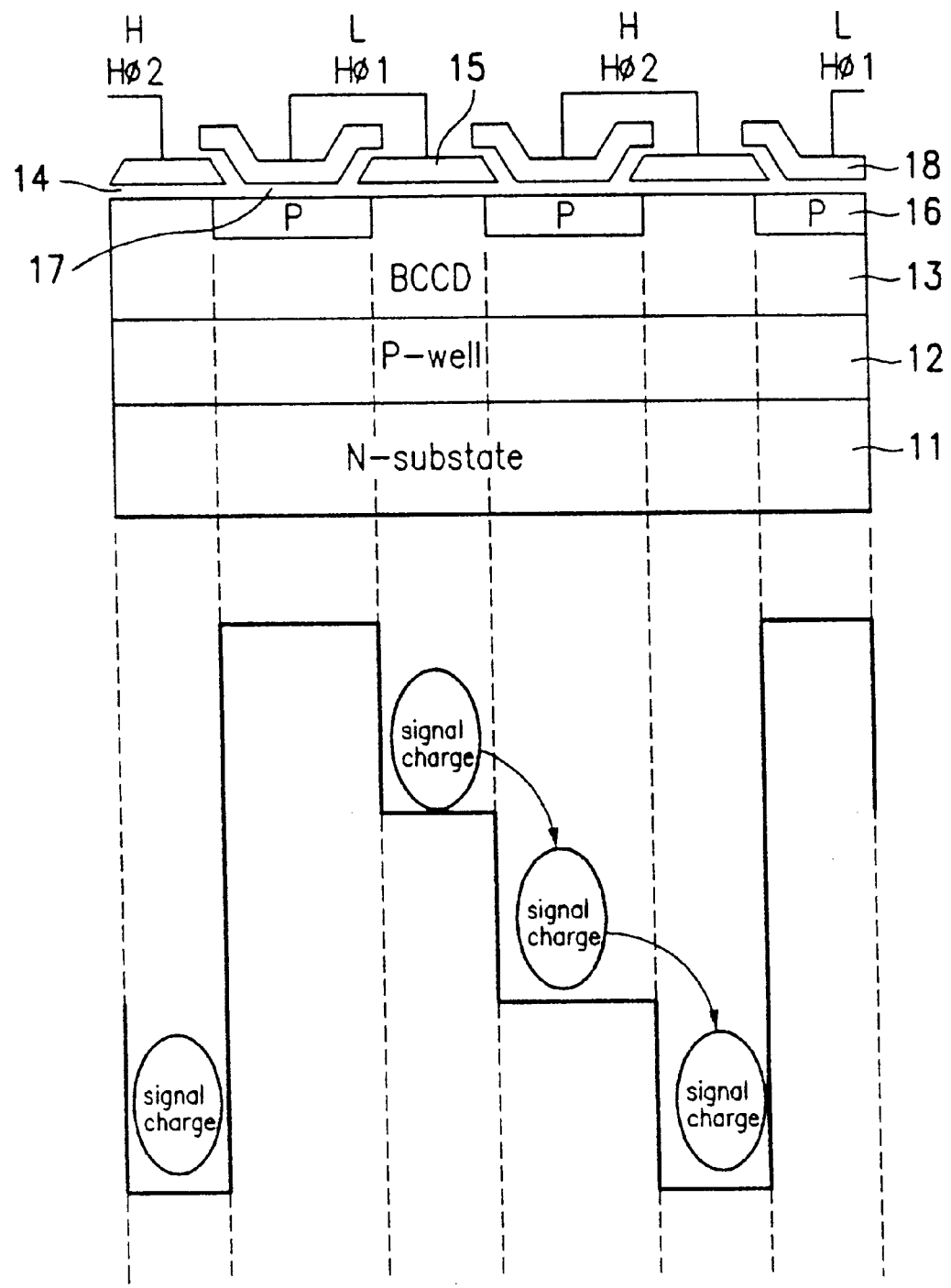
FIG. 2 is a potential profile of the related art HCCD.
Figure 3:
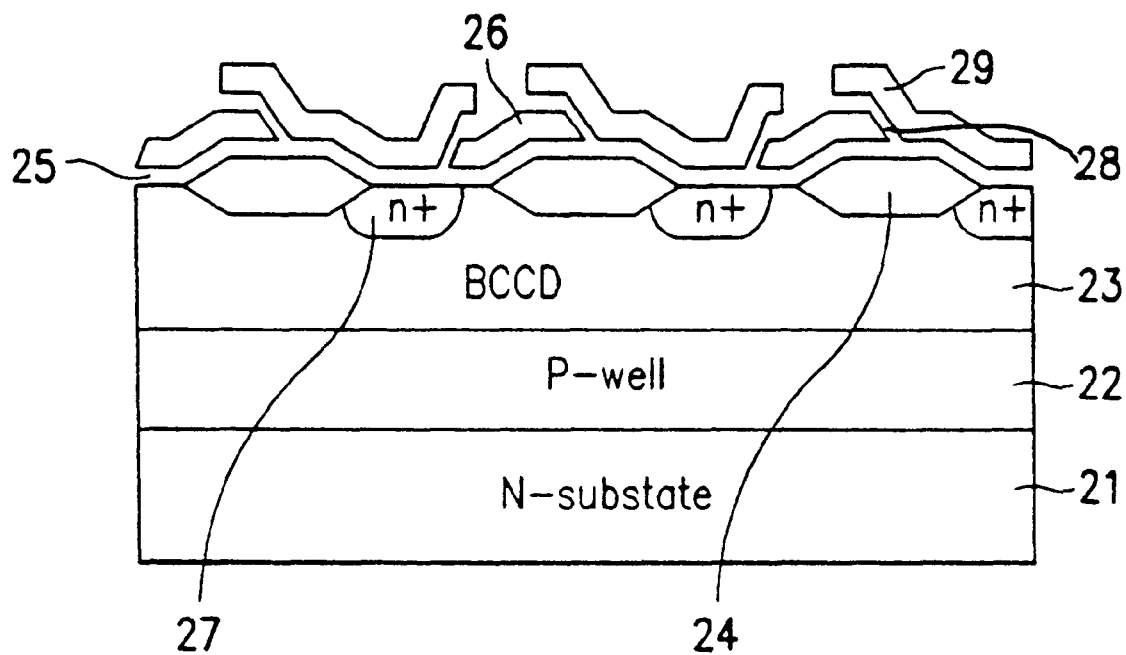
FIG. 3 is a cross-sectional view illustrating an HCCD in accordance with a preferred embodiment of the present invention.

FIG. 3 is a cross-sectional view illustrating an HCCD in accordance with a preferred embodiment of the present invention. As shown therein, the HCCD in accordance with the preferred embodiment of the present invention has no barrier regions formed by barrier ion injection. Instead, it has an insulating layer formed by a local oxidation of silicon (LOCOS) process on a surface of a substrate at which first and second polygates are overlapped with each other and an $N^+$ impurity region is formed in a surface of the substrate. For transmission of signal charges, a BCCD 23 region is formed in a P-well 22 region in an N-type semiconductor substrate 21 by buried ion injection for use as a horizontal charge transfer channel. Insulating layers 24 are formed on the BCCD 23 at a fixed interval to a height higher than a surface of the BCCD 23 having a bird's beak at both ends thereof. A gate insulating layer 25 is formed on the entire surface of the semiconductor substrate 21 including the insulating layer 24. First polygates 26 are formed on the gate insulating layer 25 separated from each other and overlapping a portion of the insulating layer 24. $N^+$ impurity regions 27 are formed in the BCCD 23 region at both sides of the first polygates 26. An interlayer insulating layer 28 is formed on the entire surface of the semiconductor substrate 21 including the first polygates 26. Second polygates 29 are formed on the interlayer insulating layer 28 and overlapped with a portion of each of the first polygate 26 and the insulating layer 24. The gate insulating layer 25 is formed of an ONO (oxide/nitride/oxide) layer, while the interlayer insulating layer 28 is formed of a nitride or HLD (high temperature low dielectric) layer. The $N^+$ impurity region 27 is doped heavier than the BCCD 23 region. The $N^+$ impurity region 27 is also formed below the bird's beak portion of the insulating layer 24.

FIGS. 4A to 4E are cross-sectional views showing the process steps of a method of fabricating the HCCD in accordance with the preferred embodiment of the present invention.

Figure 4A:
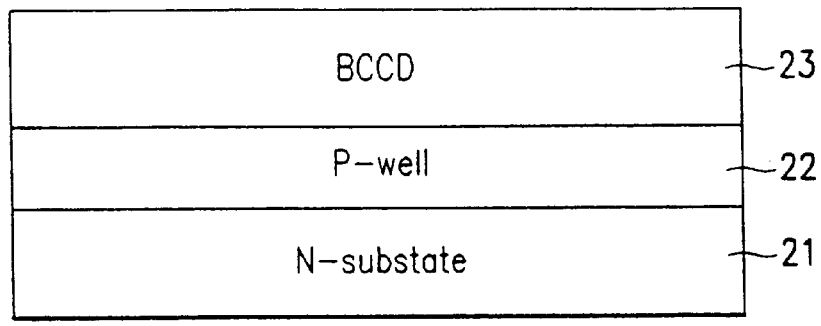
FIGS. 4A to 4E are cross-sectional views illustrating the process steps of a method of fabricating the HCCD in accordance with the preferred embodiment of the present invention; and, FIG. 5 is a potential profile of the HCCD of the present invention.

Referring to FIG. 4A, the method of fabricating the HCCD in accordance with the preferred embodiment of the present invention begins with the step of forming a P-well 22 in a surface of an N type semiconductor substrate 21. A BCCD 23 region is formed in the P-well 22 by N type buried ion implantation to be used as a horizontal signal charge transfer channel.

Figure 4B:
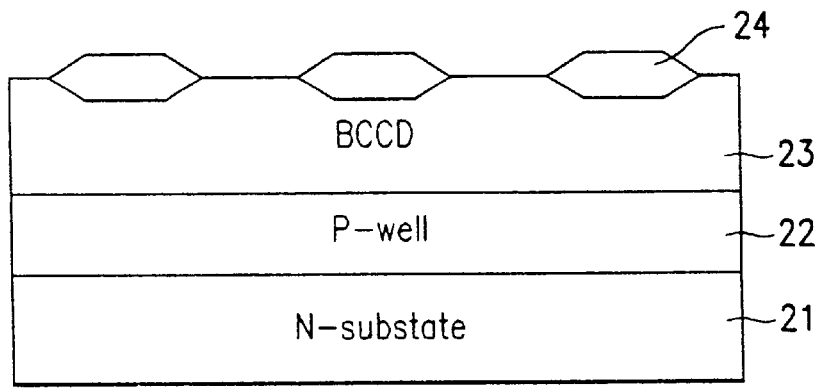

As shown in FIG. 4B, a LOCOS process is applied to the BCCD 23 region in the semiconductor substrate 21 to form an insulating layer 24. In the LOCOS process (not shown), a pad oxide layer and a nitride layer are formed on the semiconductor substrate in succession and subjected to photolithography to pattern the nitride layer. Then, the patterned nitride layer is used as a mask in applying the LOCOS process to form the insulating layer 24.

Figure 4C:
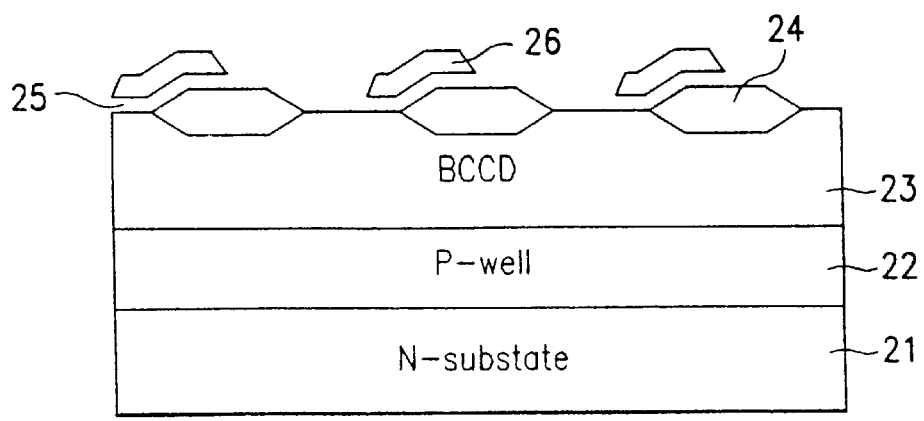

In FIG. 4C, a gate insulating layer 25 is formed on the entire surface of the semiconductor substrate 21 including the insulating layer 24 formed by the LOCOS process. A first polysilicon layer (not shown) is then formed on the gate insulating layer 25. The gate insulating layer 25 is an ONO layer. Then, the first polysilicon layer is patterned to form first polygates 26 separated from each other.

Figure 4D:
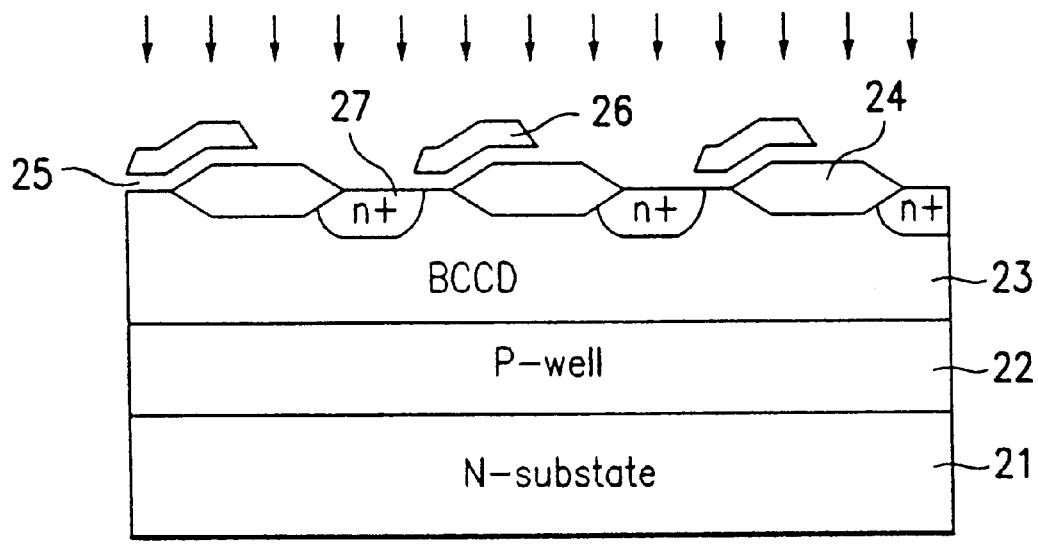

Referring to FIG. 4D, to form a potential higher than the first polygates 26, the first polygates 26 is used as a mask in heavily implanting $N^+$ type impurity ions to form $N^+$ impurity regions 27 in the BCCD 23 region at both sides of each of the first polygates 26. The $N^+$ impurity region 27 is also formed below a bird's beak portion of the insulating layer 24 formed by the LOCOS process.

Figure 4E:
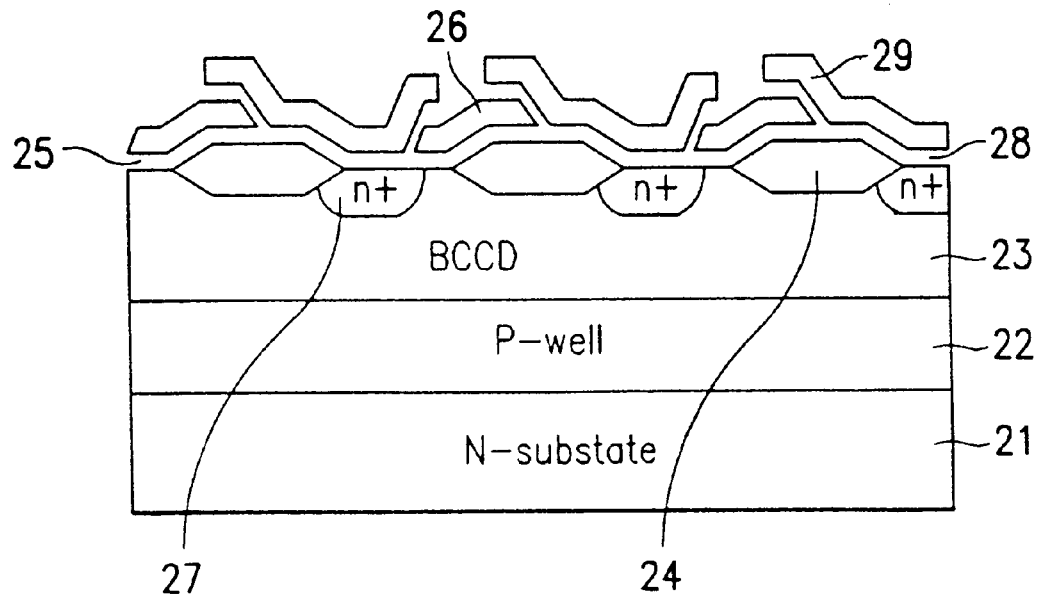

As shown in FIG. 4E, an interlayer insulating layer 28 is formed of nitride or HLD on the entire surface of the semiconductor substrate 21 including the first polygates 26. Thereafter, a second polysilicon layer (not shown) is deposited on the interlayer insulating layer 28 and selectively etched to form second polygates 29 and each of the second polygates 29 overlaps a portion of each first polygate 26. The insulating layer 24 is located below the region at which the first polygates 26 and the second polygates 29 overlap each other.

Figure 5:
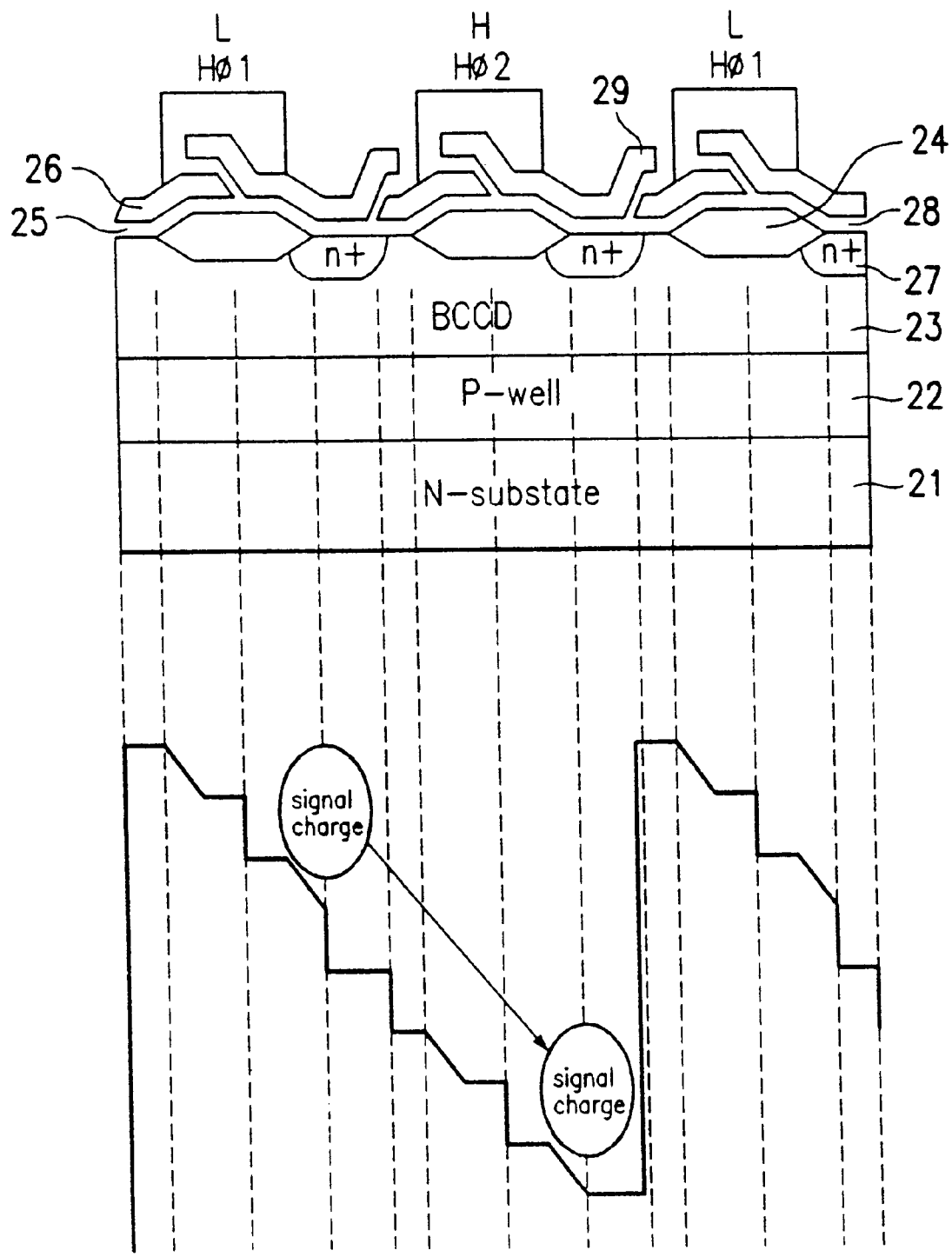

FIG. 5 is a potential profile of the HCCD of the present invention.

In the HCCD of the present invention shown in FIG. 5, a first clock signal H$\phi$1 (L) and a second clock signal H$\phi$2 (H) are alternatively applied to each set of the first polygate 26 and the second polygate 29 as one electrical unit. Thus, each adjacent set of the first polygate 26 and the second polygate 29 is supplied with the different clock signals. As a result, charges are transferred in response to the first and second clock signals H$\phi$1 and H$\phi$2, so that the signal charges are involved in a pinch-off level drop due to the insulating layer 24 below the region at which the first polygates 26 and the second polygates 29 overlap and the $N^+$ impurity region 27. As explained above, the same clock signal is applied to a set of the first and second polygates 26 and 29, and another same clock signal is applied to the adjacent set of the first and second polygates 26 and 29. Thus, a potential level is differentiated by the insulating layer 24 and the $N^+$ impurity region 27, thereby transferring the charges.

The solid state image sensor device and the method of fabricating the same have the following advantages.

Since the gates have different potentials caused by the insulating layer formed by the LOCOS process, each set of the first polygate and the second polygate are used as one electrical unit.

Further, by using the first and second polygates as one electrical unit, a charge transfer efficiency is maximized as the HCCD has a better electrical field performance in the range of a low voltage to a high voltage.

It will be apparent to those skilled in the art that various modifications and variations can be made in the solid state image sensor device and the method of fabricating the same of the present invention without departing from the spirit or scope of the invention. Thus, it is intended that the present invention cover the modifications and variations of this invention provided they come within the scope of the appended claims and their equivalents.

What is claimed is:

1. A solid state image sensor device, comprising:
   a semiconductor substrate;
   a well region in the semiconductor substrate;
   a horizontal charge transmission region in the well region;
   a plurality of insulating layers in the horizontal charge transmission region;
   a gate insulating layer on the entire surface including the insulating layers;
   a plurality of first polygates on the gate insulating layer, the first polygates being separated from each other and overlapping a portion of each insulating layer;
   a plurality of impurity regions in the horizontal charge transmission region at both sides of each first polygate;
   an interlayer insulating layer on the entire surface including the first polygates; and
   a plurality of second polygates on the interlayer insulating layer and overlapped with a portion of each first polygate.

2. The device according to claim 1, wherein the well region has a conductivity type different from the semiconductor substrate.

3. The device according to claim 1, wherein the horizontal charge transmission region includes a buried charge coupled device (BCCD).

4. The device according to claim 1, wherein the insulating layers have bird's beaks at both ends.

5. The device according to claim 4, wherein the impurity regions have a portion below the bird's beaks of the insulating layers.

6. The device according to claim 1, wherein the insulating layers are formed to be separated from each other.

7. The device according to claim 1, wherein the insulating layers have a center portion protruding from the surface of the horizontal charge transmission region.

8. The device according to claim 1, wherein the impurity regions have the same type conductivity as the semiconductor substrate and an impurity concentration higher than the semiconductor substrate.

9. The device according to claim 1, wherein the impurity regions have an N+ type conductivity.

10. The device according to claim 1, wherein the impurity regions have an impurity concentration higher than the horizontal charge transmission region.

11. The device according to claim 1, wherein the gate insulating layer is formed of an ONO (oxide/nitride/oxide) layer.

12. The device according to claim 1, wherein the interlayer insulating layer is formed of nitride.

13. The device according to claim 1, wherein the interlayer insulating layer is formed of an HLD (high temperature low dielectric) layer.

14. The device according to claim 1, wherein each of the first and second polygates having an overlapped portion over the insulating layer forms first and second pairs, the first pair of the first and second polygates is supplied with a first clock signal and the second pair of the first and second polygates is supplied with a second clock signal.

15. The device according to claim 14, wherein the second clock signal has a potential higher than the first clock signal.

* * * * *